United States Patent
Lin (10) Patent No.: US 6,958,264 B1
(45) Date of Patent: Oct. 25, 2005

(54) SCRIBE LANE FOR GETTERING OF CONTAMINANTS ON SOI WAFERS AND GETTERING METHOD

(75) Inventor: Ming-Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 511 days.

(21) Appl. No.: 09/824,933

(22) Filed: Apr. 3, 2001

(51) Int. Cl.[7] .................. H01L 21/335; H01L 21/8232
(52) U.S. Cl. ..................... 438/143; 438/310; 438/311; 438/402; 438/471; 438/473; 438/517
(58) Field of Search ................ 438/143, 311, 402, 438/310, 473, 517, 471

(56) References Cited

U.S. PATENT DOCUMENTS

| | | |
|---|---|---|
| 3,936,858 A | 2/1976 | Seeds et al. |
| 4,371,403 A | 2/1983 | Ikubo et al. ................. 148/1.5 |
| 4,498,227 A | 2/1985 | Howell et al. |
| 4,589,928 A * | 5/1986 | Dalton et al. ................ 438/143 |
| 5,162,241 A * | 11/1992 | Mori et al. .................. 438/402 |
| 5,194,395 A | 3/1993 | Wada |
| 5,244,819 A | 9/1993 | Yue ............................. 437/11 |
| 5,272,104 A | 12/1993 | Schrantz et al. |
| 5,443,661 A | 8/1995 | Oguro et al. |
| 5,453,153 A | 9/1995 | Fan et al. |
| 5,453,385 A | 9/1995 | Shinji .......................... 437/11 |
| 5,501,993 A | 3/1996 | Borland |
| 5,616,513 A * | 4/1997 | Shepard ...................... 438/402 |
| 5,646,053 A | 7/1997 | Schepis et al. |
| 5,677,222 A * | 10/1997 | Tseng .......................... 438/253 |
| 5,892,292 A * | 4/1999 | Easter ......................... 257/629 |
| 6,001,711 A | 12/1999 | Hashimoto .................. 438/473 |
| 6,228,748 B1 * | 5/2001 | Anderson et al. ........... 438/476 |

(Continued)

FOREIGN PATENT DOCUMENTS

JP          63-271941          9/1988

(Continued)

OTHER PUBLICATIONS

Wolf et al.; "Silicon Processing for the VLSI Era"; Crystalline Defects, Thermal Processing and Gettering; Basic Gettering Principles; vol. 1: Process Technology; pp. 63-70.

(Continued)

*Primary Examiner*—W. David Coleman
*Assistant Examiner*—Khiem Nguyen
(74) *Attorney, Agent, or Firm*—Renner, Otto, Boisselle & Sklar, LLP (57) ABSTRACT

A method of manufacturing a semiconductor device on a silicon-on-insulator wafer including a silicon active layer having at least two die pads formed thereon, the at least two die pads separated by at least one scribe lane, including the steps of forming at least one cavity through the silicon active layer in the at least one scribe lane; forming at least one gettering plug in each said cavity, each said gettering plug comprising doped fill material containing a plurality of gettering sites; and subjecting the wafer to conditions to getter at least one impurity into the plurality of gettering sites. A silicon-on-insulator semiconductor wafer including a silicon active layer; a plurality of die pads formed in the silicon active layer; at least one scribe lane between and separating adjacent die pads; and at least one gettering plug in the at least one scribe lane, wherein the at least one gettering plug extends through the silicon active layer and the gettering plug comprises a doped fill material having a plurality of gettering sites.

20 Claims, 4 Drawing Sheets

U.S. PATENT DOCUMENTS

| | | | | |
|---|---|---|---|---|
| 6,252,294 | B1 * | 6/2001 | Hattori et al. | 257/620 |
| 6,271,541 | B2 * | 8/2001 | Yamaguchi et al. | 257/66 |
| 6,274,460 | B1 * | 8/2001 | Delgado et al. | 438/476 |
| 6,352,924 | B1 * | 3/2002 | Wu et al. | 438/675 |
| 6,383,914 | B1 * | 5/2002 | Yasuda | 438/625 |
| 6,444,534 | B1 * | 9/2002 | Maszara | 438/311 |
| 6,465,873 | B1 * | 10/2002 | Gonzalez | 257/629 |
| 6,509,248 | B1 * | 1/2003 | Gonzalez | 438/402 |
| 6,551,866 | B1 * | 4/2003 | Maeda | 438/143 |
| 6,555,457 | B1 * | 4/2003 | Derkits et al. | 438/597 |
| 6,586,295 | B2 * | 7/2003 | Ohno | 438/221 |
| 2001/0004543 | A1 * | 6/2001 | Moore | 438/402 |

FOREIGN PATENT DOCUMENTS

| | | |
|---|---|---|
| JP | 2000-323484 | 11/2000 |
| WO | 99/26291 | 5/1999 |

OTHER PUBLICATIONS

Dziesiatv et al.; Improved SI-EPI-Wafers by Buried Damage Layer for Extrinsic Gettering; pp. 292-296.

IBM Technical Disclosure Bulletin; Gettering Technique and Structure; May 1975.

Wong et al.; "Nanoscale CMOS"; Proceedings of the IEE, vol. 87, No. 4; Apr. 1999; pp. 537-570.

* cited by examiner

SCRIBE LANE FOR GETTERING OF CONTAMINANTS ON SOI WAFERS AND GETTERING METHOD

TECHNICAL FIELD

The present invention generally relates to making silicon-on-insulator (SOI) semiconductor wafers, and in particular to a gettering method for use with an SOI wafer.

BACKGROUND OF THE INVENTION

Recently, SOI wafers increasingly have been used in very-large scale integration (VLSI) or ultra-large scale integration (ULSI) of semiconductor devices. An SOI wafer typically has a layer of silicon on top of a layer of an insulator material. In an SOI integrated circuit, essentially complete device isolation may be achieved using conventional device processing methods by surrounding each device, including the bottom of the device, with an insulator. One advantage which SOI wafers have over bulk silicon wafers is that the area required for isolation between devices on an SOI wafer is less than the area typically required for isolation on a bulk silicon wafer.

SOI wafers offer other advantages over bulk silicon technologies as well. For example, SOI wafers offer a simpler fabrication sequence compared to a bulk silicon wafer. Devices fabricated on an SOI wafer may also have better radiation resistance, less plasma-induced damage, and less cross-talk than devices fabricated on bulk silicon wafers.

Devices within integrated circuits are very sensitive to the presence of even minute concentrations of some impurities. For example, metals, such as copper, nickel, silver, gold, or iron, within the active region of a device typically degrade several device characteristics, including leakage current and oxide breakdown voltage. These and other metals rapidly diffuse through bulk silicon at temperatures typical of semiconductor device fabrication processes. Most all the transition metals have been reported as possible contaminants. Such impurities in the active region of the SOI wafer migrate out of the active region more slowly than they migrate in bulk silicon because the insulation region tends to retard impurities in the active layer from diffusing into the bulk silicon beneath the insulation region. Some impurities which have migrated to, but have been retarded by, the insulation region may re-migrate into the active region during subsequent processing steps. Accordingly, SOI wafers are subject to device and reliability problems caused by the presence of impurities that remain in the active regions.

Methods of gettering a silicon substrate are well known. Gettering is used to remove impurities or contaminants from regions of the circuit where their presence would degrade device performance. It is desirable to reduce the presence of such impurities or contaminants in the active regions in order to reduce, for example, reverse junction leakage, improve bipolar transistor gain, and increase refresh time in dynamic metal oxide semiconductor (MOS) memories.

In the manufacture of SOI integrated circuits from an SOI wafer, one of the final process steps is to dice the wafer, which contains many dies in an array, into a plurality of individual dies. In order to perform the dicing step, the wafer is divided along portions of the wafer commonly referred to as dicing rails, saw lanes or scribe lanes. When the dicing step is performed on an SOI wafer, a portion of the scribe lane remains at the perimeter of each newly separated die. The scribe lane area is available for formation of gettering sites into which contaminants resulting from cutting, packaging and/or aging may be gettered. Prior art scribe lane gettering methods, such as that of U.S. Pat. No. 6,093,624, relied upon gettering into strain areas formed in the silicon active layer of the SOI wafer when LOCOS areas were formed in the scribe lanes. However, this method provides only small gettering areas of uncontrolled size. In addition, such gettering sites may not effectively trap impurities, allowing the impurities to re-migrate to the active regions. Thus, a need remains for a scribe lane gettering method which provides a significantly increases quantity and quality of gettering sites.

SUMMARY OF THE INVENTION

A method of gettering of the active regions of semiconductor devices formed on SOI wafers is the subject of this application. In one embodiment, the present invention relates to a method of manufacturing a semiconductor device on a silicon-on-insulator wafer including a silicon active layer having at least two die pads formed thereon, the at least two die pads separated by at least one scribe lane, including the steps of forming at least one cavity through the silicon active layer in the at least one scribe lane; forming at least one gettering plug in each said cavity, each said gettering plug comprising doped fill material containing a plurality of gettering sites; and subjecting the wafer to conditions to getter at least one impurity into the plurality of gettering sites.

In one embodiment, the fill material is polysilicon. In one embodiment, the dopant ions are selected from phosphorus, arsenic, antimony, bismuth, boron, aluminum, gallium, indium, helium, neon, argon, krypton, xenon and germanium.

In another embodiment, the present invention relates to method of gettering impurities on a silicon-on-insulator wafer including a silicon active layer having at least two die pads formed thereon, the at least two die pads separated by at least one scribe lane, including the steps of forming at least one cavity through the silicon active layer in the at least one scribe lane; filling the cavity with a fill material; adding at least one dopant to the fill material to form at least one gettering plug including a plurality of gettering sites; and subjecting the wafer to conditions to getter at least one impurity into the plurality of gettering sites.

In accordance with the foregoing methods, the gettering step results in movement of gettered impurities into a silicon substrate layer of the silicon-on-insulator semiconductor wafer.

In one embodiment, the present invention further relates to a silicon-on-insulator semiconductor wafer including a silicon active layer; a plurality of die pads formed in the silicon active layer; at least one scribe lane between and separating adjacent die pads; and at least one gettering plug in the at least one scribe lane, wherein the at least one gettering plug extends through the silicon active layer and the gettering plug comprises a doped fill material having a plurality of gettering sites.

Thus, the present invention provides a method for gettering impurities into scribe lane gettering sites in an SOI wafer which addresses and overcomes the limitations of the prior art.

DETAILED DESCRIPTION

The present invention, in a first embodiment, relates generally to a method for use in manufacturing an SOI semiconductor device from a silicon-on-insulator (SOI) wafer. In one embodiment, the SOI wafer includes a plurality of individual die pads, each of which may be fabricated into a semiconductor device. The SOI semiconductor device may be, for example, an integrated circuit, a memory circuit, or a microprocessor. The method of the present invention is particularly useful in the manufacturing process of semiconductor devices fabricated upon an SOI wafer, but may be applied to semiconductor devices on other types of wafer.

As used herein, the terms "impurity" and "contaminant" are used interchangeably to refer to atoms or molecules which are not intended to be present in the particular semiconductor material. As used herein, an impurity does not include atoms or molecules which have been intentionally added to a semiconductor material and which are intended to have a function in the semiconductor material, for example, as a dopant. As used herein, impurities are generally substances which may cause deleterious or unwanted effects in the performance of the semiconductor device in which such impurity may reside. An impurity is often a metal, but may be any unwanted atoms or molecules found in the SOI wafer.

Figure 1:
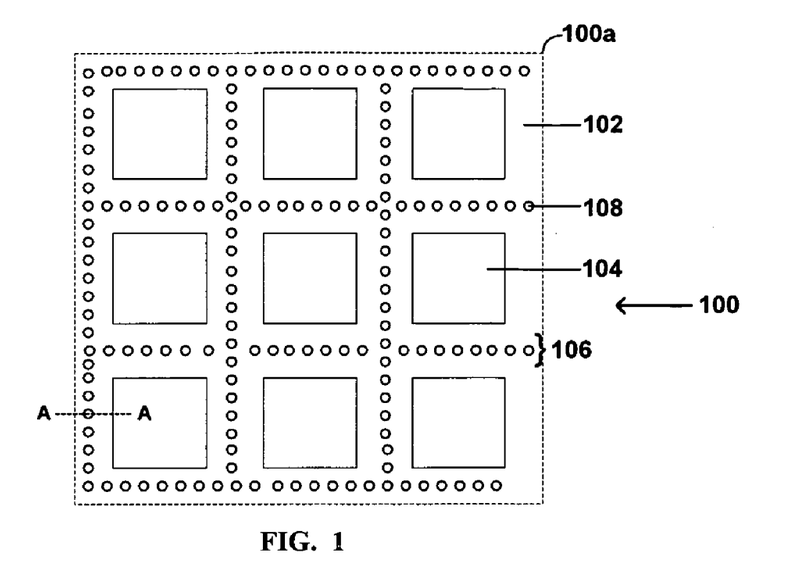
FIG. 1 is a schematic plan view of an SOI wafer comprising a plurality of individual die pads separated by scribe lanes, the scribe lanes including gettering plugs in accordance with the present invention.

FIG. 1 is a schematic plan view of a portion of an SOI wafer 100 in accordance with the present invention. The SOI wafer 100 shown in FIG. 1 comprises a silicon active layer 102 including a plurality of individual die pads 104. Semiconductor devices either have been or will be formed on each of the die pads 104. Each die pad 104 is separated from neighboring die pads 104 by at least one scribe lane 106. The scribe lane 106 comprises the interstitial space between the die pads 104, and is provided for separating the die pads 104 and for other purposes known in the art. Because the width of the scribe lane may vary, the scribe lane 106 is indicated by a bracket in FIG. 1. A plurality of gettering plugs 108 are formed in the scribe lane 106 in accordance with the present invention. As described in more detail below, each of the gettering plugs 108 include a plurality of gettering sites, into which at least one impurity from the SOI wafer 100 may be gettered. The number of gettering sites is approximately equal to the number of dopant atoms which will be included in the gettering plug 108. Thus, each gettering plug may comprise a number of gettering sites ranging from about $1 \times 10^{10}/cm^3$ to about $1 \times 10^{20}/cm^3$, or more.

In one embodiment, the gettering plug may be in the form of a filled, elongated trench, rather than a plug. The gettering plugs 108 are sufficiently spaced from the die pads 104 to attract impurities away from the die pads 104.

Figure 2:
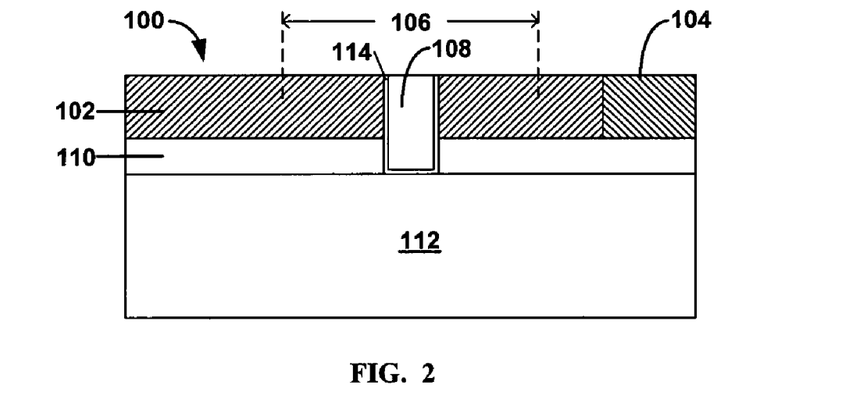
FIG. 2 is a schematic cross-sectional view, taken along line 2—2 of FIG. 1, of a first embodiment of a scribe lane gettering plug on an SOI wafer, in accordance with the present invention.

FIG. 2 shows a partial cross-sectional view of a portion of a gettering plug 108 taken along line 2—2 in FIG. 1. FIG. 2 shows a portion of the SOI wafer 100, including the silicon active layer 102, a buried oxide layer 110 and a silicon substrate 112. FIG. 2 indicates by vertical dashed lines an approximate area of a scribe lane 106. It will be recognized that the width of the scribe lane 106 may extend to the edge of the die pad 104. The SOI wafer 100 shown in FIG. 2 further includes a gettering plug 108. The gettering plug 108 may be separated from the silicon active layer 102, and thereby from the die pads 104 and the semiconductor devices thereon, by a sidewall liner 114. In FIG. 2, the gettering plug 108 extends through both the silicon active layer 102 and through the dielectric insulation layer 110 of the SOI wafer 100. In one embodiment, the SOI wafer 100 does not include a sidewall liner.

Figure 3:
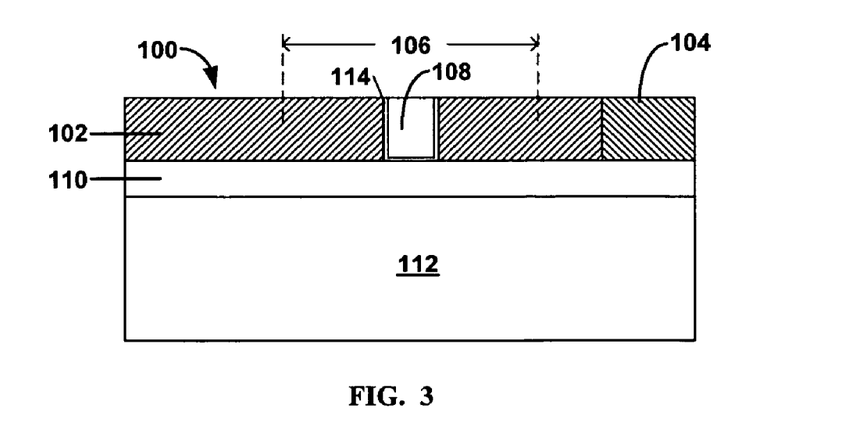
FIG. 3 is a schematic cross-sectional view, taken along line 2—2 of FIG. 1, of a second embodiment of a scribe lane gettering plug on an SOI wafer, in accordance with the present invention.

FIG. 3 shows a partial cross-sectional view of a portion of a second embodiment of the gettering plug 108, taken along line 2—2 in FIG. 1. Like FIG. 2, FIG. 3 shows a portion of the SOI wafer 100, including the silicon active layer 102, the buried oxide layer 110 and the silicon substrate 112. FIG. 3 indicates by vertical dashed lines the approximate area of the scribe lane 106, and includes the gettering plug 108. The gettering plug 108 is separated from the silicon active layer 102, and thereby from the die pads 104 and the semiconductor devices thereon, by a sidewall liner 114. In FIG. 3, the gettering plug 108 extends through the silicon active layer 102, down to but not through the dielectric insulation layer 110 of the SOI wafer 100.

The gettering plug 108 may be formed of a suitable fill material, e.g., polysilicon, doped with at least one dopant to form a plurality of gettering sites. Due to the microscopic size and very large number of the gettering sites, they are not separately shown in the figures.

Subsequent to the steps of the present method, at an appropriate time in the fabrication process, the SOI wafer 100 will be cut along the scribe lanes 106 to separate the individual die pads 104 from each other. After separation, the die pads 104 will be further processed as appropriate for the designed purpose and function of the semiconductor devices on the die pads 104. The separation may be accomplished by cutting, sawing or by other means known in the art.

In another embodiment, the SOI wafer 100 comprises a scribe lane 106 which includes a pair of parallel rows of the gettering plugs 108. In another embodiment, the scribe lane 106 comprises a gettering plug 108 which is extended to form a gettering trench. In another embodiment, the pair of parallel rows of gettering plugs 108 are extended to form a pair of parallel gettering trenches in the scribe lane 106. It is to be understood that while the present description refers to a gettering plug, the definition of the gettering plug disclosed herein is broad enough to include a round gettering plug, a square gettering plug, a rectangular gettering plug and an elongated rectangular gettering plug which constitutes a gettering trench.

Figure 10:
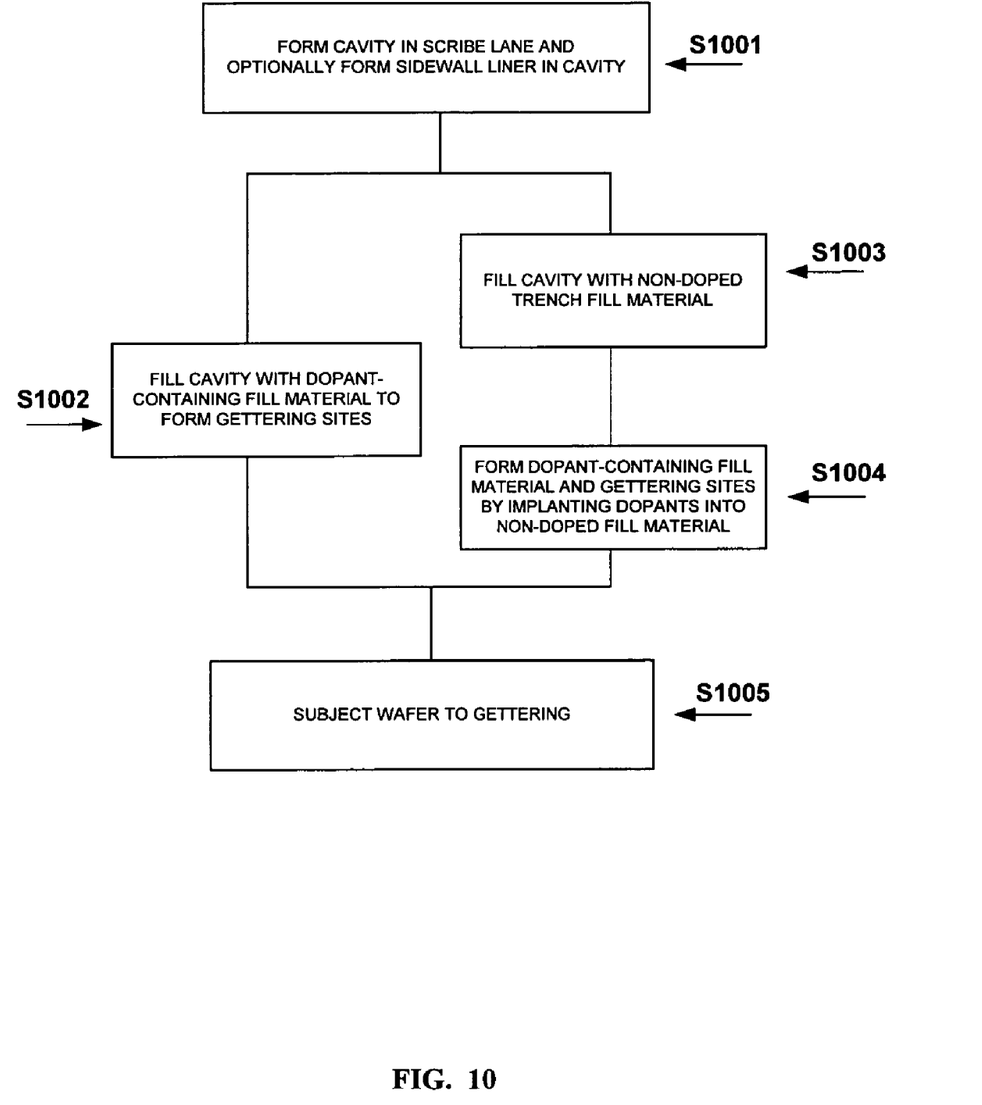
FIG. 10 is a flowchart schematically illustrating process steps of the present invention.

The following description of the method of fabricating the gettering plugs 108 formed in the scribe lane 106 refers to FIG. 10, which is a flow chart schematically illustrating the sequential steps of the method of the present invention. Additional details of the structure of the SOI wafer 100 as described above are provided as appropriate in the following description.

The SOI Wafer

The method of the present invention, in one embodiment, is applied to an SOI wafer 100 having at least one surface of a silicon active layer 102. The SOI wafer 100 may be formed by any method known in the art. The method is applied to an already-formed SOI wafer, and thus is not limited to any particular type of SOI wafer or to method of forming the SOI wafer. More detailed descriptions of the methods of formation of SOI wafers may be found, for example, in Kuo, James B. and Ker-Wei Su, "CMOS VLSI Engineering Silicon-on-Insulator (SOI)", Kluwer Academic Publishers, 1998. This publication is incorporated herein by reference for its teachings of methods of formation of SOI wafers. In addition, although the method of the present invention is particularly applicable to SOI wafers and is described in terms of SOI wafers, it is not limited thereto, being generally applicable to any semiconductor wafer having a scribe lane between adjacent die pads.

The SOI wafer 100 includes a plurality of die pads 104 formed in and on the silicon active layer 102. It will be recognized that, although FIG. 1 shows nine die pads 104, the SOI wafer 100 in practice may contain a larger number of die pads 104. The actual number of die pads 104 on the SOI wafer 100 depends on the respective sizes of the wafer and the die pads, and the arrangement of the die pads on the wafer. Accordingly, a dashed line 100a illustrates the outer periphery of the SOI wafer 100 shown in FIG. 1, to indicate that the SOI wafer 100 may extend beyond the structure shown in FIG. 1.

The plurality of die pads 104 may comprise various semiconductor devices known in the art, at various stages in the fabrication of the devices. Thus, the present method may be carried out prior or subsequent to fabrication of semiconductor devices on the die pads 104 of the SOI semiconductor wafer 100. Thus, in the following description, the gettering plugs 108 are fabricated in the scribe lanes 106 after the die pads 104 have been defined, at any point during fabrication of the semiconductor device elements. As will be understood, the steps described below for forming the gettering plugs 108 should be carried out in the order described, whether before, during or after fabrication of the semiconductor devices on the die pads 104.

Formation of Cavity for Gettering Plug

The first step of the present method, shown schematically in FIG. 10 as step S1001, comprises forming a cavity. While any known method of cavity formation may be used, etching is generally the method of choice for cavity formation. The steps of cavity formation may include forming various mask layers and photoresist layers, and etching the cavity. Any method known to those of skill in the art may be used for cavity formation.

The cavity formation step includes formation of a cavity at least through the silicon of the silicon active layer. In one embodiment, the cavity extends through the silicon active layer 102 down to, but not through, the dielectric insulation layer 110. In another embodiment, the cavity extends through both the silicon active layer 102 and the dielectric insulation layer 110, i.e., down to the substrate 112.

Figure 4:
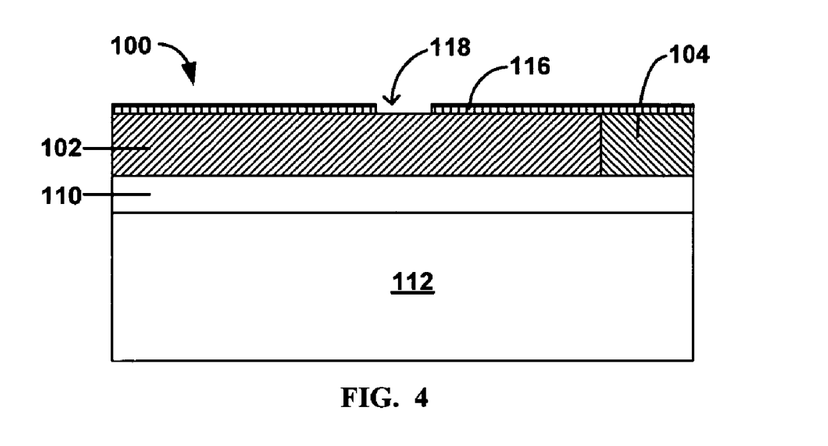
FIG. 4 is a schematic cross-sectional view of an SOI wafer similar to that shown in FIGS. 1–3, prior to formation of the gettering plug, including a layer of a photoresist for forming a cavity for a gettering plug.
Figure 5:
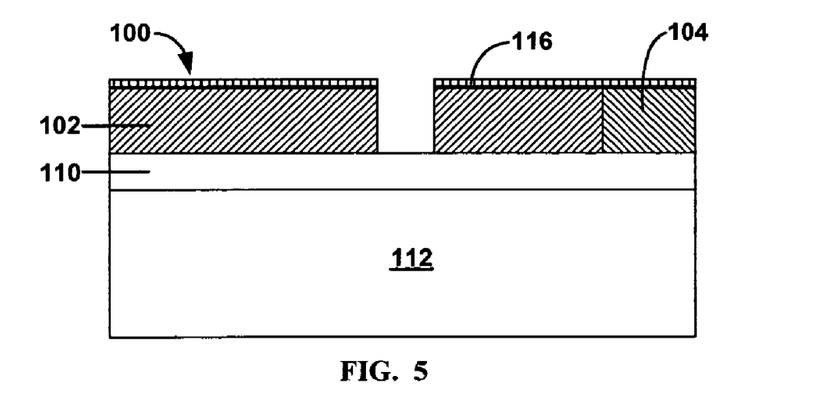
FIG. 5 is a schematic cross-sectional view of an SOI wafer, such as that shown in FIG. 4, following a step of etching a cavity for a gettering plug through the silicon layer of the SOI wafer, in accordance with the present invention.
Figure 6:
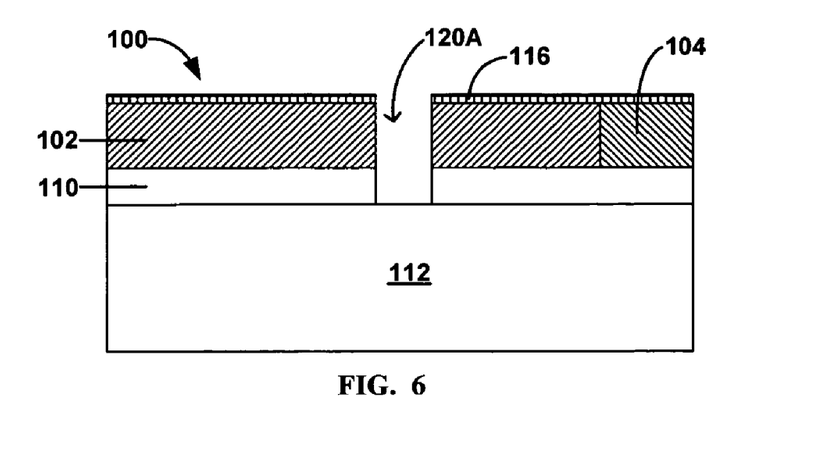
FIG. 6 is a schematic cross-sectional view of an SOI wafer, such as that shown in FIGS. 4 and 5, following a step of etching a cavity through both the silicon layer and the dielectric insulation layer of the SOI wafer, in accordance with the present invention.

Some steps of a typical method of cavity formation are schematically shown in FIGS. 4–6. Cavity formation comprises at least application of a photoresist mask 116 to define cavity etch areas 118, as shown in FIG. 4. Prior to formation of the photoresist mask 116, other layers not shown in FIG. 4, such as a pad oxide and a nitride hard mask layer, may be formed on the surface of the silicon active layer 102, upon which the photoresist mask 116 is then formed, as will be understood by those of skill in the art. The portions of the silicon layer 102 (and any overlying layers) exposed by the cavity etch areas 118 in the photoresist mask 116 are etched, so that the cavity 120 penetrates down through the silicon layer 102, as shown in FIG. 5. The cavity 120 shown in FIG. 5 is one embodiment, at a point when the etching reaches the dielectric insulating layer 110. The etching may be stopped at this point. In another embodiment, after etching through the silicon layer 102, the etching continues into and through the underlying dielectric insulation layer 110 to form the cavity 120A, such as is shown in FIG. 6. In another embodiment, not shown, the etching may penetrate into, but not through, the dielectric insulation layer 110. Both the cavity 120 and the cavity 120A are within the scope of the present invention; however, for the sake of brevity, the following describes the steps of the method with reference only to the cavity 120A shown in FIG. 6. The remaining steps of the method applied to the cavity 120 of FIG. 5 are the same as those described in relation to the cavity 120A, the only difference being the depth of the cavity 120, and whether the bottom of the cavity 106 is the dielectric insulating layer 110 or the substrate 112.

Figure 9:
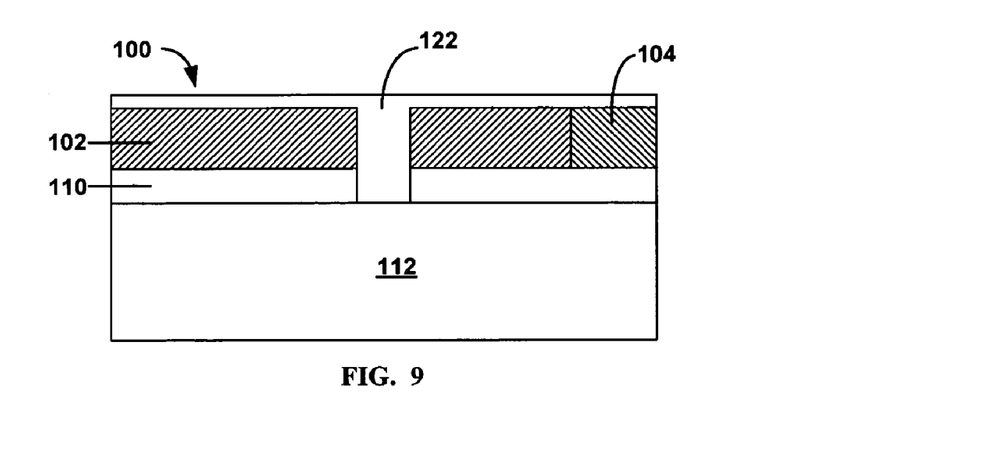
FIG. 9 is a schematic cross-sectional view of an SOI wafer, following the steps of forming a gettering plug without a sidewall liner, in accordance with an embodiment of the present invention.

In one embodiment, the step of forming at least one cavity in the at least one scribe lane includes forming the sidewall liner 114 in the cavity 120 or in the cavity 120A. The sidewall liner 114 provides additional insulation between the gettering plug (after it is formed) and the remainder of the SOI wafer 100. The sidewall liner 114 is not always necessary. When the gettering plugs in the scribe lane 106 are located a sufficient distance from the semiconductor devices on the die pads 104, the additional insulation provided by the sidewall liner 114 is not needed. FIG. 9 shows an embodiment similar to that of FIG. 7, in which no sidewall liner is included.

The step of forming the sidewall liner 114 may be carried out by any method known in the art for forming such a sidewall liner. In one embodiment, the sidewall liner 114 is formed by a deposition method such as CVD, at a temperature in the range from about 250° C. to about 650° C. In one embodiment, the sidewall liner 114 is formed by an oxidation method such as by exposing the silicon surface of the sidewall to an oxygen containing atmosphere at a temperature in the range from about 700° C. to about 1000° C.

However, such oxidation conditions may not be suitable for a wafer 100 including some semiconductor device elements.

In one embodiment, the sidewall liner is selected from silicon dioxide, silicon oxynitride, and silicon nitride. The method used should be selected taking into consideration the nature of the semiconductor devices on the die pads 104. In one embodiment, the sidewall liner is formed by CVD of silicon dioxide, by providing a source of silicon such as silane ($SiH_4$) and a source of oxygen, such as air or oxygen ($O_2$), at a temperature in the range from about 400° C. to about 600° C. In an embodiment in which silicon oxynitride is formed by CVD, a source of silicon, a source of oxygen, and a source of nitrogen (e.g., ammonia, $NH_3$) are provided to a CVD apparatus. In an embodiment in which silicon nitride is formed by CVD, a source of silicon and a source of nitrogen are provided to a CVD apparatus. Any CVD method known in the art may be used for this deposition. In addition, other known methods for applying such materials may be used, and the present invention is not limited by any particular method for forming the sidewall liner 114.

The sidewall liner is shown in FIGS. 2, 3 and 7–9. The sidewall liner 114 may have a thickness in the range from about 50 Å to about 2500 Å. In one embodiment, the sidewall liner 114 has a thickness in the range from about 100 Å to about 1000 Å.

The material which forms the sidewall liner 114 usually is deposited as a layer over the surface of the SOI wafer 100, including the upper surface of the SOI wafer 100, the sidewalls and the bottom of the cavity 120 or 120A. Following deposition of the material which forms the sidewall liner 114, the portions of the material forming a layer over the upper surface of the SOI wafer 100 may be removed.

Filling the Cavity

The present invention comprises at least two embodiments of the third step, shown alternatively as step S1002, in the left path of the flow diagram of FIG. 10, and as steps S1003 and S1004, in the right path of the flow diagram of FIG. 10. Both embodiments result in filling the cavity to form the at least one gettering plug 108 in the scribe lane 106. Formation of the gettering sites in the gettering plug 108 may proceed by either of two distinct process paths.

Figure 7:
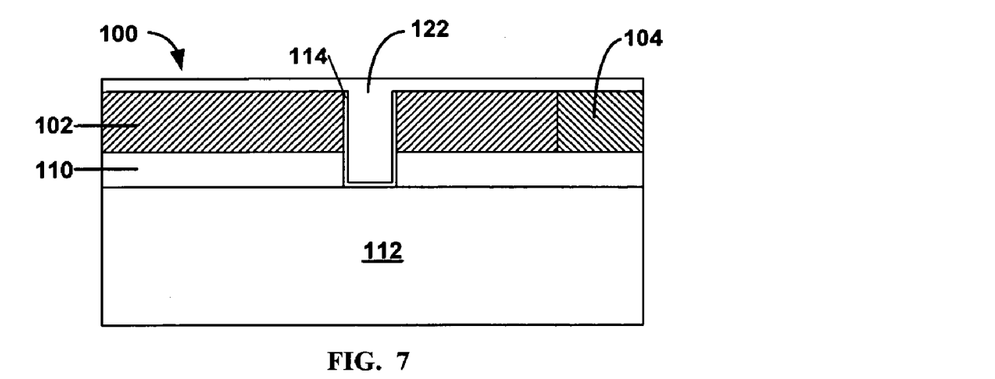
FIG. 7 is a schematic cross-sectional view of an SOI wafer, such as that shown in FIG. 6, following a step of filling a cavity for a gettering plug with a fill material and a dopant, in accordance with a first embodiment of the present invention.

In the first embodiment, the process of forming the gettering plug proceeds in a single step which includes simultaneous deposition, or codeposition, of the gettering plug material and the dopants. This single step S1002 results in formation of both the gettering plug and the gettering sites within the gettering plug. This embodiment, is illustrated in FIG. 10 as step S1002, on the left side of the flow path and the result of this step is shown in FIG. 7. FIG. 7 shows the SOI wafer 100 of FIG. 6 following deposition of a dopant-containing fill material 122. In this embodiment, the layer of dopant-containing fill material 122 both fills the cavity 120A and covers the surface of the SOI wafer 100, as shown schematically in FIG. 7.

Figure 8:
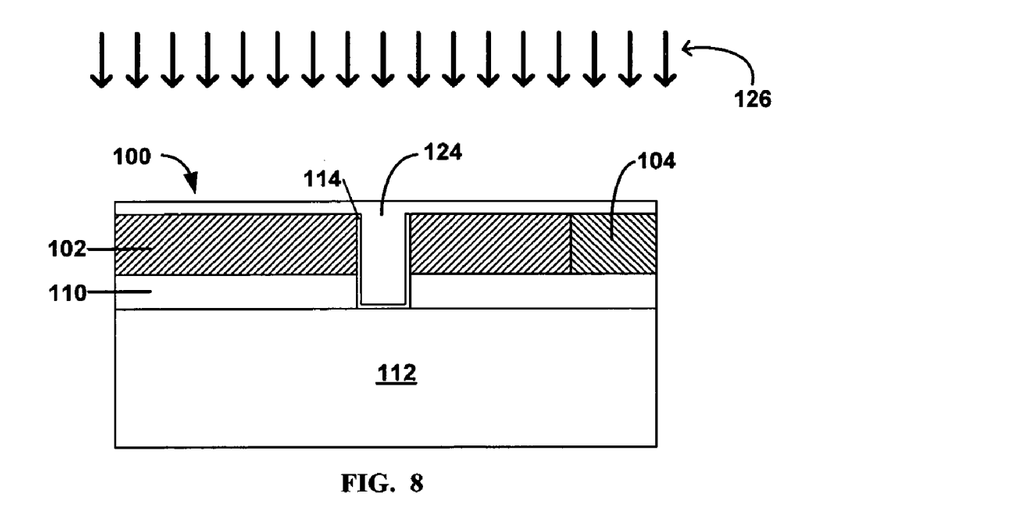
FIG. 8 is a schematic cross-sectional view of an SOI wafer, such as that shown in FIG. 7, following a step of filling a cavity for a gettering plug with a fill material, during a step of implanting a dopant, in accordance a second embodiment with the present invention.

In the second embodiment, forming the gettering plug 108 proceeds in two steps, shown as steps S1003 and S1004 in FIG. 10. As shown in FIG. 10, the first deposition step S1003 deposits the gettering plug material without dopants, and the second doping step S1004 implants the dopants resulting in formation of the gettering sites to form the gettering plug 108. The result of step S1003 is shown in FIG. 8, which shows the SOI wafer 100 following deposition of a non-doped fill material 124. Step S1004 is also shown schematically in FIG. 8, representing the implantation of dopants by arrows 126. The result of step S1004 is the same structure as that shown in FIG. 7. Consistent with the similar structures, for the purposes of the present invention, the dopant-containing fill material 122 resulting from step S1002 is substantially equivalent to the dopant-containing fill material 122 resulting from steps S1003 and S1004.

FIG. 9 shows an embodiment including the doped fill material 122, but not including a sidewall liner.

In one embodiment, the material with which the cavity 120A is filled is polysilicon, which may be doped polysilicon. While other materials may be used, polysilicon is the most practical and least expensive fill material, whether doped or undoped. Polysilicon is particularly useful for the fill material, since polysilicon constitutes a gettering material without further modification. As described below, including dopant ions in the polysilicon results in the formation of better gettering sites, into which gettered impurities not only migrate, but which also more effectively trap the impurities. Ordinary polysilicon, even stressed polysilicon, does not trap impurities as effectively as does the doped polysilicon of the present invention.

The step of filling the cavity may be carried out by any method known in the art. In an embodiment in which the fill material is either polysilicon or doped polysilicon, a chemical vapor deposition (CVD) method is appropriate. Various types of CVD are known for deposition of polysilicon. In one embodiment, polysilicon is deposited and the cavity 120A is filled thereby by LPCVD, by thermal decomposition (i.e., at 580–650° C.) of silane ($SiH_4$) (S1003). This embodiment requires a subsequent step of implanting dopant ions (S1004). In another embodiment, doped polysilicon is deposited and the cavity 120A is filled thereby by LPCVD, by thermal decomposition (i.e., at 580–650° C.) of silane ($SiH_4$) and a dopant material, such as phosphine ($PH_3$) (S1002). As is clear from the foregoing and shown in FIG. 10, when the cavity is filled with doped polysilicon (S1002), a separate dopant implantation step is not required.

The dopants which may be co-deposited with the polysilicon, i.e., by LPCVD, include phosphorus, arsenic, antimony, bismuth, boron, aluminum, gallium, indium, and germanium. These dopants may be co-deposited by providing a source of such dopants together with a source of silicon for the polysilicon. For example, when the dopant is phosphorus, a material such as phosphine ($PH_3$) may be provided to the deposition apparatus along with a source of silicon such as silane ($SiH_4$). Any suitable source of such dopants known in the art may be employed.

In an alternative cavity filling step, in a first deposition step, shown as step S1003 in FIG. 10, the cavity 120A is filled with a fill material such as polysilicon to form the non-doped fill material 124. In a second step, shown as step S1004 in FIG. 10, dopant ions are implanted into the fill material 124, thereby to form the doped fill material 122, including a plurality of gettering sites in the nascent gettering plug.

In the step S1003, the fill material 124 shown in FIG. 8 is applied to the surface of the SOI wafer 100, thereby filling the cavity 120A and covering the surface of the wafer, to form the non-doped fill material 124. The fill material 124 may be applied by any suitable method known in the art, such as CVD. In one embodiment, the fill material is applied by LPCVD. In one embodiment, the fill material 124 is polysilicon. In one embodiment, the fill material 124 is polysilicon formed by thermal decomposition of silane, $SiH_4$, at a temperature in the range from about 400° C. to about 800° C. In another embodiment, the fill material 124 may be another suitable material, such as gallium or germanium.

In the doping step S1004, ions of the dopants are implanted into the fill material 124 to transform the non-doped fill material 124 into the dopant-containing fill material 122 and to form a nascent gettering plug including plurality of gettering sites. The ions of the dopants atoms are implanted into the fill material 124 at an energy and at a dose sufficient to form the plurality of gettering sites in the nascent gettering plug 108.

In FIG. 8, implantation of the inert atoms is shown schematically by arrows 1126 being directed onto the surface of the SOI wafer 100. As will be understood, the arrows 126, like the dopants they represent, are intended to be directed primarily to the location of the nascent gettering plug 108, but some portion of the dopant ions will strike and be implanted into the fill material 124 extending over the surface of the SOI wafer 100. Thus, the wafer surface-covering layer of the fill material 124 may act as a mask, preventing the dopants from becoming implanted in, and thereby possibly affecting the operation of, any other part of the semiconductor devices on the die pads 104. Since the dopant ions are directed to the SOI wafer 100 in a collimated beam, the dopant ions are implanted primarily into the nascent gettering plug 108. The doped fill material 122 resulting from implanting dopants includes defects and dislocations which constitute gettering sites.

The at least one dopant implanted in the step S1004 may be one or more of phosphorus, arsenic, antimony, bismuth, boron, aluminum, gallium, indium, helium, neon, argon, krypton, xenon and germanium. In one embodiment, the dopant is phosphorus, in one embodiment, arsenic and in one, antimony.

In one embodiment, the dopant is implanted at an energy sufficient to form the gettering sites through the entire depth of the nascent gettering plug 108. Implanting the dopants, and forming the gettering sites at all levels of the gettering plug 108 is advantageous since the impurities gettered into the gettering plug 108 may be drawn away from, e.g., the full thickness of adjacent active regions of the SOI wafer 100 and the semiconductor devices thereon.

The dopants may be implanted by any implantation device known in the semiconductor art. The present invention is not limited to any particular form of implantation, nor to any particular implantation device. Such devices are well known to those of skill in the art.

The energy of implantation may range from about 2 to about 500 KeV for implantation into a gettering plug having a depth in the range from about 500 Å to about 10000 Å (1 $\mu$m). The exact energy depends, inter alia, on the dopant, the nature and depth of the target gettering plug, the depth to which the dopant is to be implanted in the gettering plug, and the number of gettering sites sought. When the dopant is a light element such as helium, the implantation energy may be relatively low, while still obtaining a desired depth of implantation. Conversely, a heavy element such as xenon requires a significantly higher energy to obtain the same desired depth of implantation in the same target. Persons of skill in the art can easily determine the implantation energy based on the desired depth of implantation, the particular dopant to be implanted, and the number of gettering sites sought.

Whether the dopant is formed by co-deposition with the fill material, or is implanted subsequent to deposition of the fill material, the amount of the dopant should be sufficient to obtain the number and distribution of gettering sites desired.

Subsequent to the formation of the gettering plugs 108, the portion of the layer of dopant-containing fill material 122 covering the surface of the SOI wafer 100 is removed, such as by wet etching. In the embodiment in which the dopant ions are applied in a separate step S1004, removal of the excess fill material may be delayed until after the doping step S1004. The later removal of the excess fill material may be beneficial since the excess material can act as a protective mask to help prevent implantation of dopants into the semiconductor devices in the die pads 104.

Gettering

In the gettering step of the method of the present invention, illustrated schematically as step S1005 in FIG. 10, the SOI wafer 100 is subjected to gettering conditions in order to getter impurities from the adjacent portions of the SOI wafer 100 into the gettering sites. The adjacent portions of the SOI wafer 100 may include the die pad 104, adjacent portions of the scribe lane 106 outside the die pad 104, and the area between the die pad 104 and the scribe lane 106.

The gettering step S1005 of the present invention is conventional gettering, in which the SOI wafer 100 is subjected to temperatures in the range from about 500° C. to about 900° C. for periods of about 1 to about 5000 minutes, in order to cause impurities, such as metal ions, in the adjacent portions of the SOI wafer 100 to migrate into the gettering sites within the gettering plugs 108. In one embodiment, the gettering step is carried out at a temperature of about 600° C. In one embodiment, the gettering step is carried out at a temperature of about 700° C. In one embodiment, the gettering step is carried out at a temperature of less than about 800° C. In one embodiment, the gettering step is carried out at a temperature in the range from about 600° C. to about 750° C.

The exact temperature at which gettering takes place depends upon the impurities which are to be gettered. Since gettering is a process of moving impurity atoms or ions through the crystal lattice of the silicon layer 102, the rate at which the impurities move is a function of both the temperature and the solubility of the impurities in the silicon layer 102. Thus, the exact temperature at which gettering takes place depends upon the particular impurities which are desired to be gettered, as will be understood by those of skill in the art. Such persons can easily determine the exact conditions at which the desired gettering takes place.

As will be understood, since in the present invention the gettering may be carried out after semiconductor devices have been completely fabricated on the SOI wafer 100, or when the devices have been substantially completely fabricated on the SOI wafer 100, the wafer cannot safely be subjected to unduly high temperatures. The gettering temperature is generally lower than a temperature required for crystallization or recrystallization of the fill material, since such temperatures may damage the semiconductor device. As will be further understood, as time and temperature of gettering are increased, the relative speed of gettering of any particular species generally increases. At higher temperatures, shorter times may be used, and conversely, at lower temperatures, longer times may be required, in order to obtain the same degree of gettering of a given species.

In the present invention, the gettering step results in the migration of impurity atoms or molecules into gettering sites in the gettering plug 108. In one embodiment, the gettering step results in the migration of impurity atoms or molecules from the die pad 104 into gettering sites in the gettering plug 108. The gettering sites, as is known in the art, include, e.g., dislocations, crystal defect sites and other irregular sites existing in the fill material 122 forming the gettering plug 108, which result from the dopant ions in the fill material 122.

The impurities which may be gettered include metals, and particularly the transition metals. In one embodiment, the metals which may be gettered include heavy metals. In one embodiment, the metals which may be gettered include one or more metals such as nickel, palladium, platinum, copper, silver, gold, palladium, ruthenium, chromium, tantalum, iron, cobalt, tungsten, lead, zinc, tin, zirconium, titanium, vanadium, manganese, aluminum, niobium and tantalum. In one embodiment, the metallic impurities may include compounds of the foregoing metals, such as oxides, nitrides, sulfides or mixed compounds thereof.

The steps summarized and shown as steps S1001–S1005 in FIG. 10, and described above, constitute the basic steps of the method of the present invention. Thereafter, further processing of the semiconductor device to complete the fabrication process may be undertaken.

What has been described above are certain embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of manufacturing a semiconductor device on a silicon-on-insulator wafer including a silicon active layer having at least two die pads formed thereon, the at least two die pads separated by at least one scribe lane, comprising the steps of:
    forming at least one cavity through the silicon active layer in the at least one scribe lane;
    forming at least one gettering plug in each said cavity, each said gettering plug comprising doped fill material containing a plurality of gettering sites; and
    subjecting the wafer to conditions to getter at least one impurity into the plurality of gettering sites.

2. The method of claim 1, wherein the doped fill material is polysilicon formed by LPCVD deposition of the polysilicon and a dopant in the cavity.

3. The method of claim 2, wherein the dopant is one or more selected from phosphorus, arsenic, antimony, bismuth, boron, aluminum, gallium, indium, helium, neon, argon, krypton, xenon and germanium.

4. The method of claim 3, wherein the dopant is phosphorus.

5. The method of claim 1, wherein the step of forming at least one cavity further comprises forming a sidewall liner in the cavity.

6. The method of claim 1, wherein the gettering plug extends down through the silicon active layer, and contacts a dielectric insulation layer on the wafer.

7. The method of claim 1, wherein the gettering plug extends down through both a silicon active layer and a dielectric insulation layer on the wafer.

8. The method of claim 7, wherein in the gettering step gettered impurities migrate into a silicon substrate layer below the dielectric insulation layer.

9. A method of gettering impurities on a silicon-on-insulator wafer including a silicon active layer having at least two die pads formed thereon, the at least two die pads separated by at least one scribe lane, comprising the steps of:
    forming at least one cavity through the silicon active layer in the at least one scribe lane;
    filling the cavity with a fill material;
    adding at least one dopant to the fill material to form at least one gettering plug including a plurality of gettering sites; and
    subjecting the wafer to conditions to getter at least one impurity into the plurality of gettering sites.

10. The method of claim 9, wherein the dopant is one or more selected from phosphorus, arsenic, antimony, bismuth, boron, aluminum, gallium, indium, helium, neon, argon, krypton, xenon and germanium.

11. The method of claim 9, wherein the step of forming at least one cavity further comprises forming a sidewall liner in the cavity.

12. The method of claim 9, wherein the fill material is polysilicon, and the dopant is added by one of codeposition and implantation.

13. The method of claim 9, wherein the gettering plug extends through the silicon active layer, and contacts a dielectric insulation layer on the wafer.

14. The method of claim 9, wherein the gettering plug extends through both the silicon active layer and a dielectric insulation layer on the wafer.

15. The method of claim 14, wherein in the gettering step gettered impurities move into a silicon substrate layer below the dielectric insulation layer.

16. A method of gettering impurities on a silicon-on-insulator wafer including a silicon active layer, buried oxide layer and a silicon substrate, the silicon active layer having at least two die pads formed thereon, the at least two die pads separated by at least one scribe lane, comprising the steps of:
    forming a plurality of cavities through the silicon active layer and the buried oxide layer to the silicon substrate in the at least one scribe lane;
    filling the cavities with a fill material;
    implanting at least one dopant into the fill material in the cavities to form at least one gettering plug including a plurality of gettering sites; and
    subjecting the wafer to conditions to getter at least one impurity into the plurality of gettering sites.

17. The method of claim 16, wherein in the gettering step, gettered impurities move into the silicon substrate.

18. The method of claim 16, wherein the wafer comprises a plurality of adjacent die pads and a single scribe lane separates each die pad from the adjacent die pads.

19. The method of claim 18, wherein the scribe lane comprises a single row of gettering plugs, a pair of parallel rows of gettering plugs or a pair of parallel gettering trenches.

20. The method of claim 16, wherein the dopant is one or more selected from phosphorus, arsenic, antimony, bismuth, boron, aluminum, gallium, indium, helium, neon, argon, krypton, xenon and germanium.

* * * * *

UNITED STATES PATENT AND TRADEMARK OFFICE
CERTIFICATE OF CORRECTION

PATENT NO. : 6,958,264 B1
DATED : October 25, 2005
INVENTOR(S) : Lin

Page 1 of 1

It is certified that error appears in the above-identified patent and that said Letters Patent is hereby corrected as shown below:

Title page,
Item [56], References Cited, U.S. PATENT DOCUMENTS, add
-- 5,753,560
  5,773,152
  5,795,809
  5,807,771
  5,818,085
  5,882,990
  5,889,732
  5,926,727
  5,929,508
  5,965,917
  5,976,956
  6,010,950
  6,013,584
  6,022,793
  6,024,888
  6,083,324
  6,093,624
  6,100,202
  6,114,223
  6,133,123
  6,429,481 --.

Signed and Sealed this

Thirty-first Day of January, 2006

JON W. DUDAS
*Director of the United States Patent and Trademark Office*